(12) United States Patent
Raja et al.

(10) Patent No.: US 6,819,179 B2
(45) Date of Patent: Nov. 16, 2004

(54) VARIABLE GAIN LOW NOISE AMPLIFIER

(75) Inventors: Muthusamy Kumarasamy Raja, Singapore (SG); Nuntha Kumar Krishnasamy Maniam, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 10/417,318

(22) Filed: Apr. 16, 2003

(65) Prior Publication Data

US 2004/0207471 A1 Oct. 21, 2004

(51) Int. Cl.⁷ ................................................ H03G 3/10
(52) U.S. Cl. ..................................... 330/285; 330/278
(58) Field of Search ............................... 330/285, 278, 330/302

(56) References Cited

U.S. PATENT DOCUMENTS

| | | | | |
|---|---|---|---|---|
| 6,046,640 | A | 4/2000 | Brunner | 330/254 |
| 6,184,751 | B1 * | 2/2001 | Siomkos et al. | 330/278 |
| 6,366,166 | B1 * | 4/2002 | Belot | 330/252 |
| 6,392,492 | B1 | 5/2002 | Yuan | 330/311 |
| 6,424,222 | B1 * | 7/2002 | Jeong et al. | 330/285 |
| 6,438,364 | B1 * | 8/2002 | Waite | 455/323 |
| 6,466,095 | B1 | 10/2002 | Suzuki | 330/311 |
| 2003/0067359 | A1 * | 4/2003 | Darabi et al. | |

FOREIGN PATENT DOCUMENTS

EP       0977352 A2    2/2000    ............. H03F/1/22

OTHER PUBLICATIONS

Tommy K.K. Tsang et al., "Gain Controllable Very Low Voltage (≤1 V) 8–9 GHz Integrated CMOS LNA's," 2002. IEEE Radio Frequency Integrated Circuits Symposium pp. 205–208.

* cited by examiner

Primary Examiner—Patricia Nguyen
(74) Attorney, Agent, or Firm—George O. Saile; Stephen B. Ackerman

(57) ABSTRACT

The load of the cascode amplifier is varied by connecting another (secondary) load in parallel with the original load. The secondary load is connected through a MOSFET switch. During the High Gain Mode the MOSFET switch is OFF and the secondary load is electrically isolated from the main load, whereas in the Low Gain Mode the switch is turned ON and the secondary load appears across the primary load, reducing the effective load impedance. The secondary load is AC coupled such that the DC bias current does not pass through the secondary load and hence the Noise Figure (NF) and linearity (IIP3) performance are better in the Low Gain Mode. A number of such switchable loads can be connected across the load to obtain programmability.

50 Claims, 4 Drawing Sheets

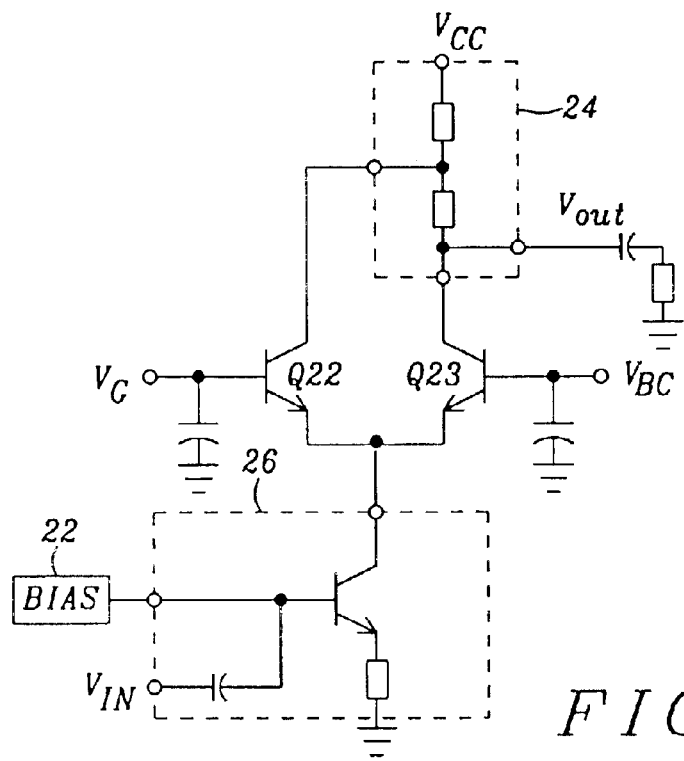
*FIG. 1 — Prior Art*
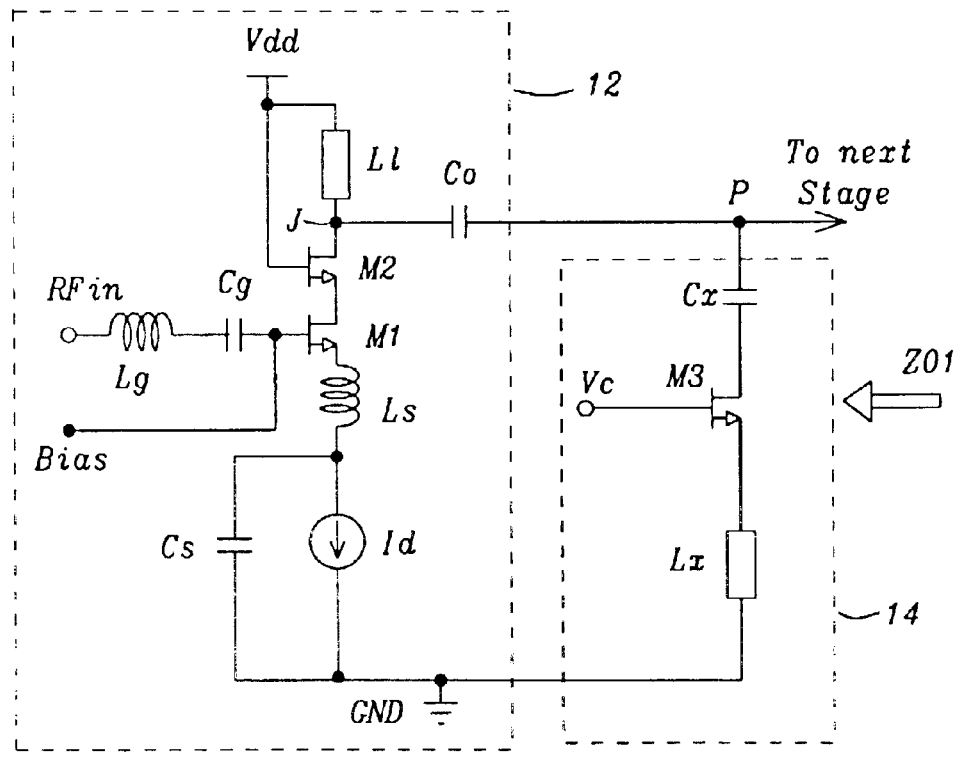
*FIG. 2*

VARIABLE GAIN LOW NOISE AMPLIFIER

BACKGROUND OF THE INVENTION

1. Field of the Invention

This invention relates generally to the control of the gain of amplifiers or other high frequency blocks such as filter attenuators etc., by switching the load impedance. The invention in particular relates to controlling the gain of a Low Noise Amplifier (LNA).

2. Description of the Related Art

The problem of gain control versus the noise figure (NF) of low noise amplifiers as frequencies go steadily higher in the Giga Hertz range is a continuing challenge to all workers in this field. We now describe a circuit of the related art by referring to FIG. 1. FIG. 1 is taken from U.S. Pat. No. 6,046,640 (Brunner), discussed below, and is referred there to as FIG. 6. The circuit is a switched-gain cascode amplifier, including an input stage 26, a loading network 24, first and a second cascode transistors Q22, Q23, and a bias signal generator 22. The input stage 26 receives a bias signal $V_{BIAS}$ and the input signal $V_{IN}$. The loading network 24 is coupled to a power supply voltage $V_{CC}$ and provides an output signal $V_{OUT}$ to a load. The input to the base of the first cascode transistor is a gain control signal $V_G$. The input to the base of the second cascode transistor is a base control signal $V_{BC}$. As mentioned the load is connected to the loading network 24 which attenuates the output signal by a different amount depending on which input terminal the signal is switched to.

Listed below are related patents and a publication which bear on this problem:

U.S. Pat. No. 6,466,095 B1 (Susuki) dated Oct. 15, 2002, Power Amplifier:—relates to gain variation and power amplification, whereas our invention, described below, is for a low noise amplifier (LNA). Unlike the LNA, the Power Amplifier (PA) is a large signal block, i.e., it deals with higher signal power. The main performance criterion for a PA is efficiency while for the LNA the main performance criterion is the Noise Figure (NF). In addition, the circuit of the PA itself is different from the LNA. The PA gain control scheme is also entirely different and can not be applied to the LNA.

U.S. Pat. No. 6,392,492 B1 (Yuan) dated May 21, 2002, High Linearity Cascode Low Noise Amplifier, and EP 0 977 352 A2 (Fong), Noise Figure and Linearity Improvement Technique using Shunt Feedback:—both patents are for LNAs and teach techniques to improve the Noise Figure and linearity of the LNA in its normal (High Gain) mode of operation, whereas our invention proposes a gain control circuit for the LNA. The proposed Variable Gain LNA achieves the best Noise Figure in the High Gain mode and best linearity (surely better than the achievable linearity of the quoted patents) in the Low Gain mode. In addition, the reduced gain in the Low Gain mode greatly reduces the linearity requirements of the following blocks like Mixers, Filters etc, resulting in a power-efficient overall receiver. Reduced gain also reduces the dynamic range of the AGC circuit, which helps to improve the Signal to Noise Ratio (SNR).

U.S. Pat. No. 6,046,640 (Brunner) dated Apr. 4, 2000, Switched-Gain Cascode Amplifier Using Loading Network for Gain Control:—this patent also is about Variable Gain LNAs. This circuit bypasses both AC and DC signals to ground in the Low Gain mode, whereas our proposed circuit bypasses only the AC signal to ground thereby not wasting the DC power. The main advantage of doing so in our scheme is that the Noise Figure and Linearity in the Low Gain mode is improved substantially. Also the input impedance is unaffected and the gain flatness is improved during gain variation. Another advantage is that one can get any amount of gain control with this circuit. Based on the requirement, the circuit can be optimized for the gain variation or the linearity or both in the Low Gain mode.

Related Publication: Gain Controllable Very Low Voltage ($\leq 1$ V) 8–9 GHz Integrated CMOS LNA's, T. K. K. Tsang and M. N. El-Gamal," *IEEE RFIC Symposium* 2002. The scheme proposed in this publication controls the gate bias of the PMOS transistor in the folded cascode topology and does not sacrifice the NF in Low Gain mode. A parallel tank circuit is used from VDD to the amplifier which needs lots of care to achieve in a commercially packaged LNA. The gain control scheme which we propose not only achieves a better NF but also a superior third order intercept point (IIP3) in the Low Gain mode.

SUMMARY OF THE INVENTION

It is an object of at least one embodiment of the present invention to provide a circuit and a method where the load of the cascode amplifier is varied by connecting another (secondary) load in parallel with the original load through a switch which also acts as a voltage controlled resistor.

It is another object of the present invention to provide a number of such switchable loads which are connected across the load to obtain programmability of the gain.

It is yet another object of the present invention to vary the load impedance as a function of a control voltage.

It is still another object of the present invention to improve the noise figure and to reduce the linearity requirements in low gain mode.

It is a further object of the present invention to use the bias current effectively in the low gain mode.

These and many other objects have been achieved by connecting a secondary load through a MOSFET switch. During the High Gain Mode the MOSFET switch is OFF and the secondary load is electrically isolated from the main load, whereas in the Low Gain Mode the switch is turned ON and the secondary load appears across the primary load, thereby reducing the effective load impedance. The secondary load is AC coupled such that the DC bias current does not pass through the secondary load and hence the Noise Figure (NF) and linearity (IIP3) performance are better in the Low Gain Mode.

These and many other objects and advantages of the present invention will be readily apparent to one skilled in the art to which the invention pertains from a perusal of the claims, the appended drawings, and the following detailed description of the preferred embodiments.

BRIEF DESCRIPTION OF THE DRAWINGS

FIG. 1 is a circuit diagram of a switched-gain amplifier of the related art.

FIG. 2 is a circuit diagram showing the principle of the present invention.

Use of the same reference number in different figures indicates similar or like elements.

DESCRIPTION OF THE PREFERRED EMBODIMENT

Figure 3:
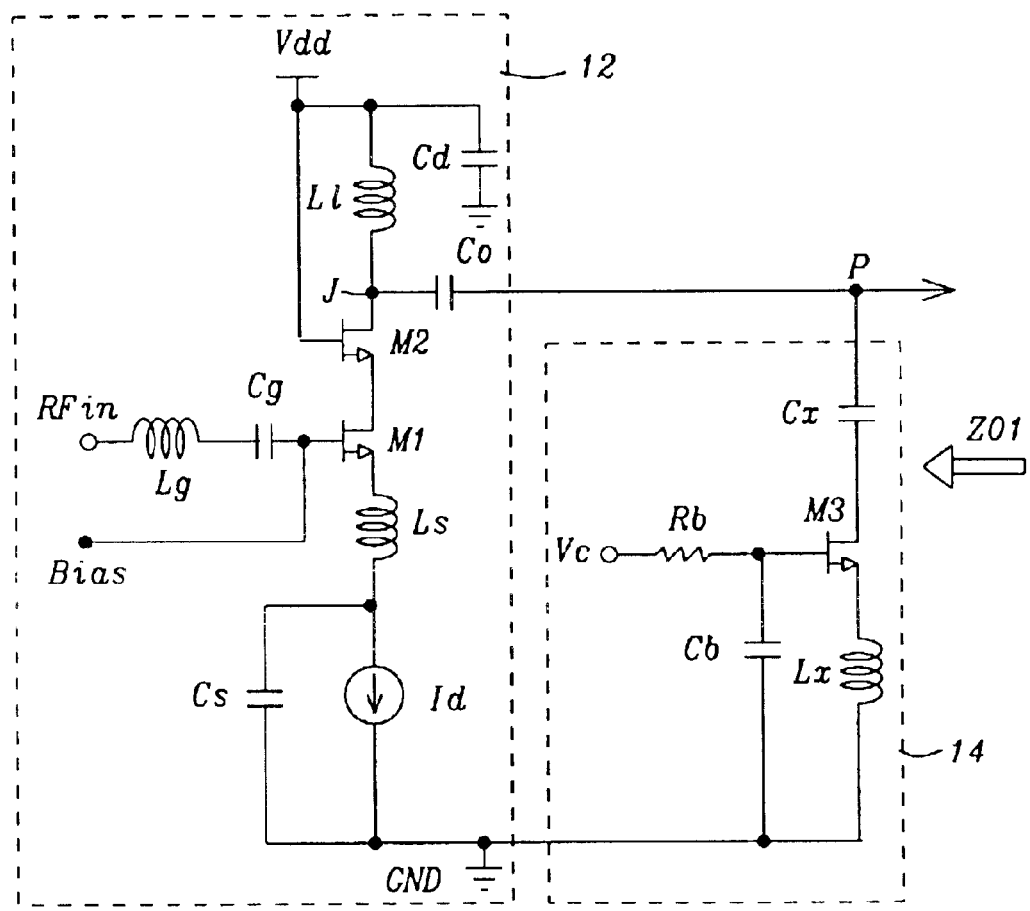
FIG. 3 is circuit diagram of a first preferred embodiment of the present invention.

Referring now to FIG. 2 we describe the general principle of the invention. The Variable Gain low noise amplifier (LNA) 10 comprises a cascode amplifier stage 12 and a gain control circuit 14. The cascode amplifier stage comprises in series between the positive and negative terminal of a power supply, respectively Vdd and ground (GND) by way of illustration, a primary load $L_L$, transistors M2 and M1, inductor Ls and a current source $I_D$, which has capacitor Cs shunted across it. Input RFin is coupled via inductor Lg and capacitor Cg to the gate of transistor M1. In addition, input Bias is coupled to the gate of transistor M1 for biasing M1. The gate of transistor M2 is coupled to Vdd. The junction J between transistor M2 and load L is coupled via capacitor Co to the output node P of the LNA. Coupled between output node P and the negative terminal of the power supply (ground) is gain control circuit 14. Gain control circuit 14 typically comprises, in series between output node P and ground, a capacitor Cx, transistor M3, and a secondary load Lx. The gate of transistor M3 is coupled to a control voltage Vc. The gate bias voltage is the gain control voltage Vc and is varied from 0 to Vdd.

When Vc=0 V, M3 is OFF and the gain control circuitry offers a high impedance at P with respect to ground. Hence, the output of the LNA is delivered to the next stage and the whole LNA operates in High Gain mode. When Vc=Vdd, M3 will be in the ON state and offers a low resistance between its drain and source. Now, the secondary load appears effectively across the load of the LNA, thereby reducing the overall load impedance and hence results in reduced gain of the LNA. In other words, part of the output of the first stage is shunted to ground and therefore the overall gain is reduced.

The advantage of this scheme is that the drain current of M1 and M2 (and thus the gate overdrive) remains the same, even in the Low Gain mode and hence the Noise Figure (NF) and third order intercept point (IIP3) performance of the first stage is not sacrificed. In fact, there is a slight improvement in IIP3 of the first stage due to the reduced gain.

In order to maintain the gain flatness, the impedance $Z_{O1}$ at output node P with respect to ground must remain in the same quadrant (in the real and imaginary plane) in the desired frequency band when M3 is ON as well as OFF. When M3 is OFF, this impedance is due only to the primary load $L_L$. In the absence of the secondary load, $Z_{O1}$ would not be in the same plane due to the presence of Cgs and Csb of M3, when M3 is ON. Hence the secondary load Lx is adjusted to keep $Z_{O1}$ in the same plane.

When Vc takes on values between 0 and 1.8V, M3 acts as a voltage controlled resistor. Therefore the load impedance is varied as a function of Vc and thus the gain can be varied continuously by varying the control voltage Vc. The size of M3 determines the amount of gain control that can be achieved.

Detailed Description of the Preferred Embomdiment

FIG. 3 shows a Variable Gain LNA 10 in one of its simple forms. FIG. 3 is similar to FIG. 2, except that a) a decoupling capacitor $C_D$ is coupled between Vdd and ground, b) loads $L_L$ and Lx are shown as inductors, c) resistive means Rb is coupled between the gate of M3 and Vc, and c) capacitor Cb is coupled between the gate of M3 and ground.

The LNA is matched to the input impedance through Lg, Ls and the gate-to-source capacitance Cgs (not shown) of M1 for the desired frequency band of operation. Capacitor Cs is used to provide RF ground to Ls. Transistors M1 (Common Source) and M2 (Common Gate) form the cascode amplifier. Cd is the decoupling capacitor. Inductive Load $L_L$ is used rather than a resistive load as the inductive load offers lower NF and better IIP3. The overlap transistor gate-to-drain capacitance Cgd (not shown) of M2 and the load inductance $L_L$ determine the output impedance $Z_{O1}$. Usually the input impedance of the following stage is optimized for gain and gain flatness with respect to this $Z_{O1}$. The network consisting of Cx, M3, Lx, Rb and Cb is the gain control circuitry. Cx blocks the DC current from entering the gain control circuit since we want to bypass only the AC signal to ground through M3 and Lx. M3 acts as a voltage controlled resistor controlled by Vc.

When M3 is OFF, $Z_{O1}$ is inductive because of Lx. In the absence of the secondary load, when M3 is ON, $Z_{O1}$ becomes capacitive due to the presence of Cgs and Csb (not shown) of M3. The secondary load inductor Lx ensures that $Z_{O1}$ is inductive even when M3 is ON. Since $Z_{O1}$ remains inductive for all values of Vc the gain flatness is not affected. The low pass network consisting of Rb and Cb at the gate of M3 is to isolate the RF from DC. By adding a resistive means (not shown) in series with Lx, one can trade off gain and IIP3. In fact, Lx can be replaced by any RLC network based on the requirements of IIP3 and gain step. Since the drain current of M1 and M2 does not pass through M3 for all values of Vc, the NF and IIP3 are even better when M3 is ON (Low Gain Mode).

Modifications of the Preferred Embodiment

In a second preferred embodiment of the present invention the primary and secondary loads $L_L$ and Lx are RLC networks consisting of series and parallel combinations of all the three elements or two or one of the RLC elements. In fact, the secondary load Lx is added to get the gain flatness and in its simplest form can be replaced by a short.

In a third preferred embodiment of the present invention the switching means shown as NMOSFETs can be PMOSFETs or can be implemented in BJT or BiCMOS technology as well.

In a fourth preferred embodiment of the present invention this technique of bypassing the signal through a voltage-controlled resistive means can be used for any CMOS, BJT or BiCMOS circuit like a filter, Mixer, Power Amplifier etc and is not limited to a LNA.

Figure 4:
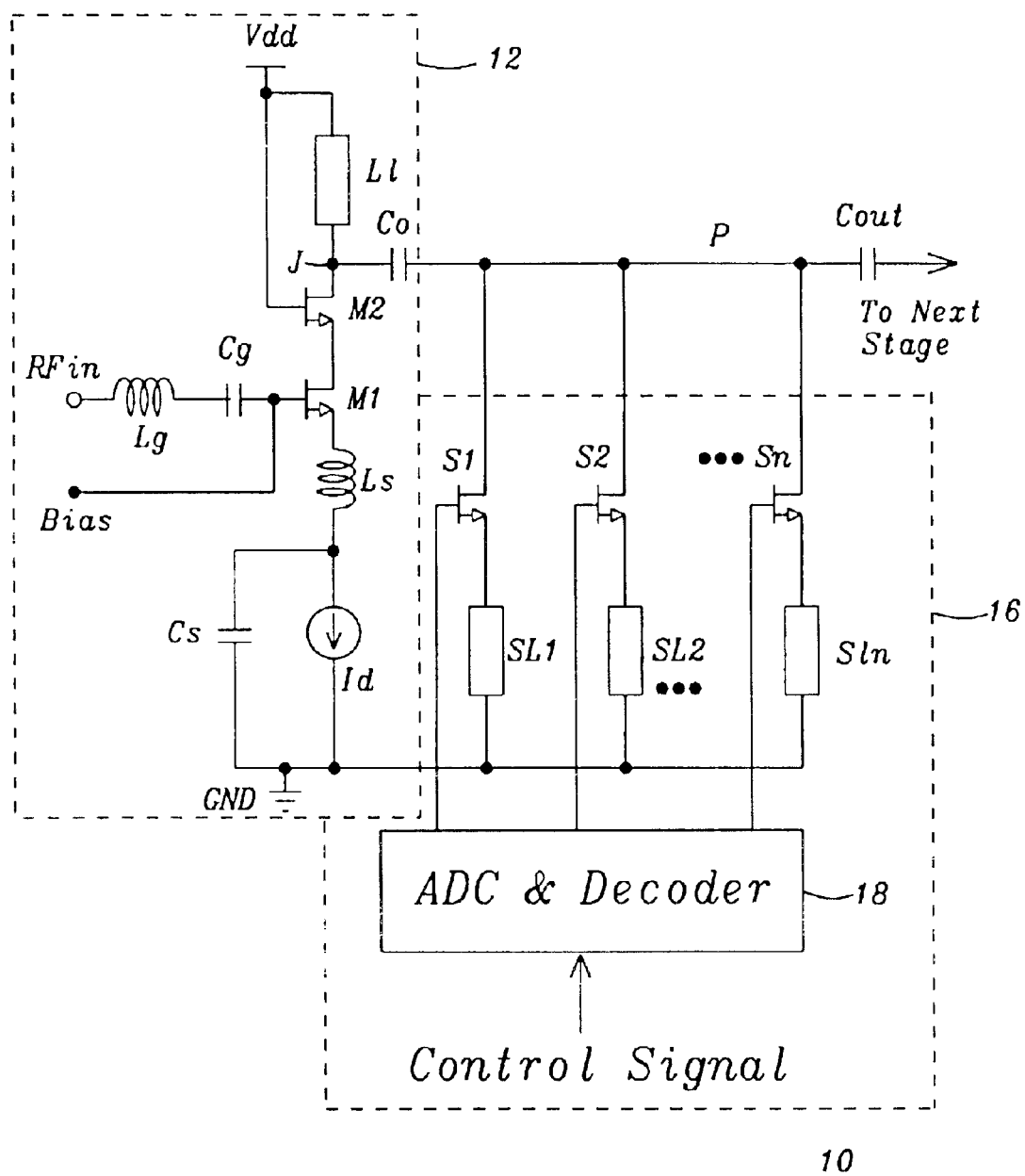
FIG. 4 is circuit diagram of another preferred embodiment of the present invention.

In a fifth preferred embodiment of the present invention a number of such gain control circuits are combined into a gain control block 16 and connected as shown in FIG. 4 for gain programmability. FIG. 4 is similar to FIG. 2 as far as the cascode amplifier stage 12 is concerned but has gain control block 16 coupled to the output node P. In addition, capacitor Cout is coupled between output node P and the primary load (not shown) of the next stage. Gain control block 16 comprises an analog-to-digital converter (ADC) and decoder 18, which is driven by analog control signals. Coupled between output node P and the ADC&Decoder 18 are a plurality of control circuits ranging from 1,2, to n, comprising switching means S1, S2, to Sn and secondary loads SL1, SL2 to SLn. Where switching means 'n' in series with secondary load 'n' are coupled between output node P and ground. ADC&Decoder 18 has 'n' outputs, where outputs 1, 2, to n go to the gate of switching means 1, 2, to n, respectively. It is thus possible to activate any or all (there are $n^2$ combinations) of the secondary loads. Decoders of this type are well known to those skilled in the art and need not to be explained further. This allows complete programmability of the secondary load.

Figure 5:
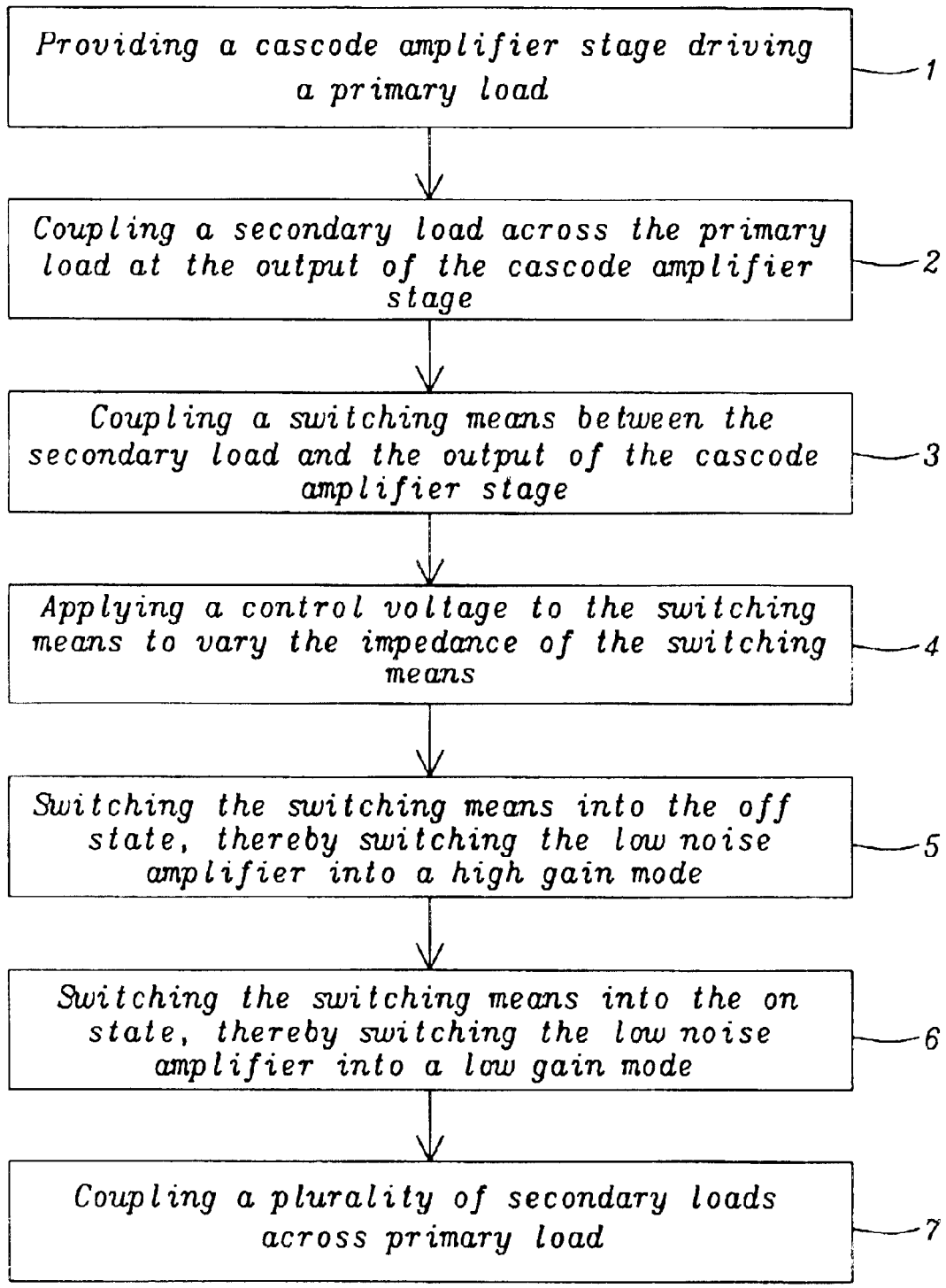
FIG. 5 is a block diagram of the method of the present invention.

Referring now to FIG. 5, we describe the method of varying the gain of a low noise amplifier:

Block 1 provides a cascode amplifier stage driving a primary load;

Block 2 couples a secondary load across the primary load at the output of the cascode amplifier stage;

Block 3 couples a switching means between the secondary load and the output of the cascode amplifier stage;

Block 4 applies a control voltage to the switching means to vary the impedance of the switching means;

Block 5 switches the switching means into the OFF state, thereby switching the low noise amplifier into a high gain mode;

Block 6 switches the switching means into the ON state, thereby switching the low noise amplifier into a low gain mode, and Block 7 couples a plurality of secondary loads across the primary load.

While the invention has been particularly shown and described with reference to the preferred embodiments thereof, it will be understood by those skilled in the art that various changes in form and details may be made without departing from the spirit and scope of the invention.

What is claimed is:

1. A low noise amplifier comprising:

a cascode amplifier stage with an input and an output, said amplifier stage delivering an amplified high frequency input signal to a primary load at said output, where the load of said cascode amplifier stage is varied by coupling a secondary load in parallel with said primary load, where said secondary load is AC coupled using capacitive means such that a DC bias current cannot pass through said secondary load; and a gain control circuit coupled to said output of said cascode amplifier stage, said gain control circuit providing said secondary load, where said secondary load is coupled via switching means to said output of said cascode amplifier stage, where said secondary load is varied by controlling the resistance of said switching means.

2. The low noise amplifier of claim 1, wherein said cascode amplifier stage is in a high gain mode when said switching means is not conducting.

3. The low noise amplifier of claim 1, wherein said secondary load is electrically isolated from said primary load when said switching means is not conducting.

4. The low noise amplifier of claim 1, wherein said cascode amplifier stage is in a low gain mode when said switching means is conducting.

5. The low noise amplifier of claim 1, wherein said secondary load is coupled across said primary load when said switching means is conducting, thereby reducing the effective load seen by said cascode amplifier stage.

6. The low noise amplifier of claim 1, wherein said switching means acts as a voltage controlled resistive means.

7. The low noise amplifier of claim 6, wherein said voltage controlled resistive means is varied as the control voltage is varied at the control gate of said switching means.

8. The low noise amplifier of claim 1, wherein a plurality of said switching means is arranged in a series/parallel circuit.

9. The low noise amplifier of claim 1, wherein said switching means is a NMOS transistor.

10. The low noise amplifier of claim 1, wherein said switching means is a PMOS transistor.

11. The low noise amplifier of claim 1, wherein said switching means is a BJT transistor.

12. The low noise amplifier of claim 1, wherein a plurality of said secondary loads is arranged in a series/parallel circuit.

13. The low noise amplifier of claim 1, wherein said secondary load is a resistive means.

14. The low noise amplifier of claim 1, wherein said secondary load is an inductive means.

15. The low noise amplifier of claim 1, wherein said secondary load is a capacitive means.

16. A variable gain low noise amplifier comprising:

a cascode amplifier stage with an input and an output, said amplifier stage delivering an amplified high frequency input signal to a primary load at said output, where the load of said cascode amplifier stage is varied by coupling a secondary load, through a load switching means, in parallel with said primary load, where said secondary load is AC coupled using capacitive means such that a DC bias current cannot pass through said secondary load; and a gain control circuit coupled between said output of said cascode amplifier stage and the negative terminal of a power supply with a positive and a negative terminal, said gain control circuit providing said secondary load, where said variable gain low noise amplifier is in a low gain mode when said secondary load is switched in through said load switching means, and where said variable gain low noise amplifier is in a high gain mode when said secondary load is switched out.

17. The variable gain low noise amplifier of claim 16, wherein said cascode amplifier stage further comprises:

a first gain stage means coupled to a second gain stage means, where the control gate of said first gain stage means is coupled to biasing means, and via a first capacitive means in series with a first inductive means, to said input of said cascode amplifier stage; where the source of said first gain stage means is coupled via a second inductive means in series with a current source to the negative terminal of said power supply, where the drain of said second gain stage means is coupled via a third inductive means to the positive terminal of said power supply, and where the junction of said drain of said second gain stage means and said third inductive means is coupled to said output of said cascode amplifier stage.

18. The variable gain low noise amplifier of claim 16, wherein said gain control circuit further comprises:

a first capacitive means, said load switching means, and said secondary load all in series and coupled between said output of said cascode amplifier stage and the negative terminal of said power supply, where the control gate of said load switching means is coupled via resistive means to a control input providing a control voltage.

19. The variable gain low noise amplifier of claim 18, wherein said load switching means acts as a voltage controlled resistive means which is varied as said control voltage is varied at the control gate of said load switching means.

20. The variable gain low noise amplifier of claim 16, wherein the control gate of said load switching means is coupled via a second capacitive means to the negative terminal of said power supply.

21. The variable gain low noise amplifier of claim 16, wherein said load switching means of said gain control circuit is conducting when said secondary load is switched in.

22. The variable gain low noise amplifier of claim 16, wherein said load switching means of said gain control circuit is not conducting when said secondary load is switched out.

23. The variable gain low noise amplifier of claim 16, wherein a plurality of said switching means is arranged in a series/parallel circuit.

24. The variable gain low noise amplifier of claim 16, wherein said load switching means is a NMOS transistor.

25. The variable gain low noise amplifier of claim 16, wherein said load switching means is a PMOS transistor.

26. The variable gain low noise amplifier of claim 16, wherein said load switching means is a BJT transistor.

27. The variable gain low noise amplifier of claim 16, wherein a plurality of said secondary loads is arranged in a series/parallel circuit.

28. The variable gain low noise amplifier of claim 16, wherein said secondary load is a resistive means.

29. The variable gain low noise amplifier of claim 16, wherein said secondary load is an inductive means.

30. The variable gain low noise amplifier of claim 16, wherein said secondary load is a capacitive means.

31. A low noise amplifier comprising:

a cascode amplifier stage with an input and an output, said amplifier stage delivering an amplified high frequency input signal to a primary load at said output, where the load of said cascode amplifier stage is varied by coupling a secondary load in parallel with said primary load, where said secondary load is AC coupled using capacitive means such that a DC bias current cannot pass through said secondary load; and a programmable gain control coupled to said output of said cascode amplifier stage to provide said secondary load, said programmable gain control having decoding means to couple a plurality of load elements via load switching means to said output of said cascode amplifier stage by switching said load elements in and out, thereby varying the gain of said cascode amplifier stage.

32. The low noise amplifier of claim 31, wherein said cascode amplifier stage further comprises:

a first gain stage means coupled to a second gain stage means, where the control gate of said first gain stage means is coupled to biasing means, and via a first capacitive means in series with a first inductive means, to said input of said cascode amplifier stage; where the source of said first gain stage means is coupled via a second inductive means in series with a current source to the negative terminal of said power supply, where the drain of said second gain stage means is coupled via a third inductive means to the positive terminal of said power supply, and where the junction of said drain of said second gain stage means and said third inductive means is coupled to said output of said cascode amplifier stage.

33. The low noise amplifier of claim 31, wherein said programmable gain control further comprises:

an analog-to-digital converter and decoder with a number of outputs equal to the plurality of said load elements, where each of said load elements comprises said load switching means in series with an impedance and coupled between said output of said cascode amplifier stage and the negative terminal of a power supply with a positive and a negative terminal, where the control gate of each of said load switching means is coupled to one of said outputs of said analog-to-digital converter and decoder.

34. The low noise amplifier of claim 31, wherein said secondary load is varied as the control voltage is varied at the control gate of said load switching means.

35. The low noise amplifier of claim 31, wherein a plurality of said switching means is arranged in a series/parallel circuit.

36. The low noise amplifier of claim 31, wherein said load switching means is a NMOS transistor.

37. The low noise amplifier of claim 31, wherein said load switching means is a PMOS transistor.

38. The low noise amplifier of claim 31, wherein said load switching means is a BJT transistor.

39. The low noise amplifier of claim 31, wherein a plurality of said secondary loads is arranged in a series/parallel circuit.

40. The low noise amplifier of claim 31, wherein said secondary load is a resistive means.

41. The low noise amplifier of claim 31, wherein said secondary load is an inductive means.

42. The low noise amplifier of claim 31, wherein said secondary load is a capacitive means.

43. A gain control circuit comprising:

a capacitive means, a load switching means, and a load, all in series, and coupled between the output of said gain control circuit and a reference potential, where the input of said gain control circuit is coupled to the control gate of said load switching means, where a control voltage, applied to said input, controls the impedance of said gain control circuit, such that when said load switching means is off, thus creating a high resistance between the terminals of said switching means, said gain control circuit offers a high impedance between said output and said reference potential, and when said load switching means is on, thus creating a low resistance between the terminals of said switching means, said gain control circuit offers a low impedance between said output and said reference potential.

44. The gain control circuit of claim 43, wherein a capacitive means is coupled between said output and said load switching means to provide AC coupling for said load.

45. The gain control circuit of claim 43, wherein said control voltage when varied, varies the gain of a filter circuit when coupled to said output of said gain control circuit.

46. The gain control circuit of claim 43, wherein said control voltage when varied, varies the gain of a mixer circuit when coupled to said output of said gain control circuit.

47. The gain control circuit of claim 43, wherein said control voltage when varied, varies the gain of an amplifier circuit when coupled to said output of said gain control circuit.

48. The method of varying the gain of a low noise amplifier, comprising the steps of:

a) providing a cascode amplifier stage driving a primary load;

b) AC coupling a secondary load across said primary load at the output of said cascode amplifier stage;

c) coupling a switching means between said secondary load and the output of said cascode amplifier stage;

d) applying a control voltage to said switching means to vary the impedance of said switching means;

e) switching said switching means into the off state, thereby switching said low noise amplifier into a high gain mode;

f) switching said switching means into the on state, thereby switching said low noise amplifier into a low gain mode, and g) AC coupling a plurality of said secondary loads across said primary load.

49. The method of claim 48, whereby the gain of said low noise amplifier can be varied continuously by varying said control voltage.

50. The method of claim 48, where controlling said secondary loads through a decoder, provides programmability of the gain of said low noise amplifier.

* * * * *

UNITED STATES PATENT AND TRADEMARK OFFICE
CERTIFICATE OF CORRECTION

| | |
|---|---|
| PATENT NO. | : 6,819,179 B2 |
| DATED | : November 16, 2004 |
| INVENTOR(S) | : Muthusamy Kumarasamy Raja, Nuntha Kumar S/O and Krishnasamy Maniam |

It is certified that error appears in the above-identified patent and that said Letters Patent is hereby corrected as shown below:

<u>Title page,</u>
Item [75], Inventors, delete "Nuntha Kumar Krishnasamy Maniam, Singapore (SG)", and replace with -- Nuntha Kumar S/O Krishnasamy Maniam, Singapore (SG) --.

Signed and Sealed this

First Day of March, 2005

JON W. DUDAS
*Director of the United States Patent and Trademark Office*